United States Patent [19]

Hunka

[11] 4,263,555

[45] Apr. 21, 1981

[54] SIGNAL DETECTION SYSTEM

[75] Inventor: George W. Hunka, Bellmawr, N.J.

[73] Assignee: RCA Corporation, New York, N.Y.

[21] Appl. No.: 48,826

[22] Filed: Jun. 15, 1979

[51] Int. Cl.$^3$ ............................................ H03K 5/153
[52] U.S. Cl. .................................... 328/165; 307/359; 307/264; 328/116; 328/162
[58] Field of Search ............... 307/358, 359, 237, 354, 307/264; 328/116, 168, 172, 175, 162, 165, 147, 149; 340/146.3 AC, 146.3 AE, 146.3 AG

[56] References Cited

U.S. PATENT DOCUMENTS

| | | | |
|---|---|---|---|
| 3,737,790 | 6/1973 | Brown | 307/358 X |
| 3,758,868 | 9/1973 | Brown | 307/359 X |
| 3,999,083 | 12/1976 | Bumgardner | 307/358 |
| 4,114,034 | 9/1978 | Hunka | 250/202 |
| 4,128,760 | 12/1978 | Del Signore | 250/214 B |
| 4,156,854 | 5/1979 | Weller | 330/259 |
| 4,158,859 | 6/1979 | Kerbel | 358/228 |

OTHER PUBLICATIONS

G. W. Hunka, "Aided-Track Cursor for Improved Digitizing Accuracy", Photogrammetric Engineering and Remote Sensing, vol. 44, No. 8, Aug., 1978, pp. 1061-1066.

Primary Examiner—John Zazworsky
Attorney, Agent, or Firm—P. J. Rasmussen; P. M. Emanuel; Clement A. Berard, Jr.

[57] ABSTRACT

A signal detection system, of a type suitable for use in line scanning or character recognition apparatus, for providing substantially invariant output signal waveforms in response to repetitive input signals superimposed on pedestal levels. The input signals and pedestal signals may vary substantially. The signal detection system includes a forward signal path including apparatus for amplifying and slicing the input signals, a degenerative feedback path including apparatus for generating a balance signal which is proportional to the amplified difference between an average of the output signals and a reference level, and, the detection system also includes apparatus for subtractively applying the balance signal to substantially eliminate the effects of the pedestal signals on the output waveform.

9 Claims, 4 Drawing Figures

SIGNAL DETECTION SYSTEM

The Government has rights in this invention pursuant to contract F30602-77-C-0243 awarded by the Department of the Air Force.

This invention relates to a system for the detection of repetitive input signals which are superimposed upon an offset potential or pedestal level, which system provides a substantially invariant output signal waveform.

A signal detection system of the type disclosed is suitable for use in line scanning or character recognition apparatus and particularly in a system for converting graphic information to a digitized form as is described in my U.S. Pat. No. 4,114,034 issued Sept. 12, 1978 and entitled "OPTICAL CURSOR TRACKING CORRECTION SYSTEM."

In systems for scanning graphic material, for example, those employing photosensitive linear arrays, the photodetector composite output signal includes a first component responsive to the characteristics of the feature being scanned superimposed on a second component (pedestal level) responsive to the background. The signal varies widely in response to the intensity and optical spectrum of the light source, the color and texture of the graphic material, the width and intensity of the line, and the contrast between the feature and the background.

One approach to improving the operation of such photodetector apparatus incorporates an ultra-stable light source to keep the pedestal level constant; however, it is difficult to maintain performance over a sustained period due to fluctuations in light intensity, aging of the light source, and differences in the graphic materials being digitized.

U.S. Pat. No. 4,128,760 issued to J. R. DelSignore on Dec. 5, 1978 and entitled "AMBIENT LIGHT COMPENSATING CIRCUIT" illustrates compensation for ambient light inputs using a first sensor responsive to both the background and the feature to be detected and a second sensor responsive only to the background. Signals from the two independent sensors are subtracted one from the other; responses from the background material are neutralized, leaving a signal substantially representing the feature to be detected. Limitations on this approach include the need to closely match the two sensors (initially and over their useful life) and to have a light source and background color and texture generating similar responses from both sensors.

Automatic gain control (AGC) applied to signal detection circuits responds in proportion to signals representing the line information and the background pedestal level. AGC tends to insure that subsequent circuitry does not saturate in response to the effective DC input level of the pedestal (offset potential). Output signals remain responsive to that offset potential causing the desired signals to vary in response to the AGC action as well as the characteristics of the feature being detected.

Another approach taken in the prior art employs AC coupling between the photodetector output and the signal detection circuitry to remove the DC component of the pedestal level. This tends to pass noise along with the desired signal, generating erroneous outputs if sensitivity is high. AC coupling may be completely unusable in a system where the input signal component is superimposed upon a pedestal level component including reference pulses (synchronization pulses). Unless the amplitude of the line responsive signal is a significant portion (e.g., $> \frac{1}{2}$) of the timing pulse height, it will not be detected.

A signal detection system embodying the present invention includes a forward signal path having means for amplifying and slicing the input signals applied thereto to derive an output signal. The system also includes a degenerative feedback path having means for generating a balance signal proportional to the amplified difference between an average of the output signal and a reference level. The balance signal is subtracted from the input signal to substantially eliminate the effects of pedestal level and input signal variations on the output such that the output waveform of the signal detection system has constant pulse height and constant pulse width.

IN THE DRAWING

Figure 1:
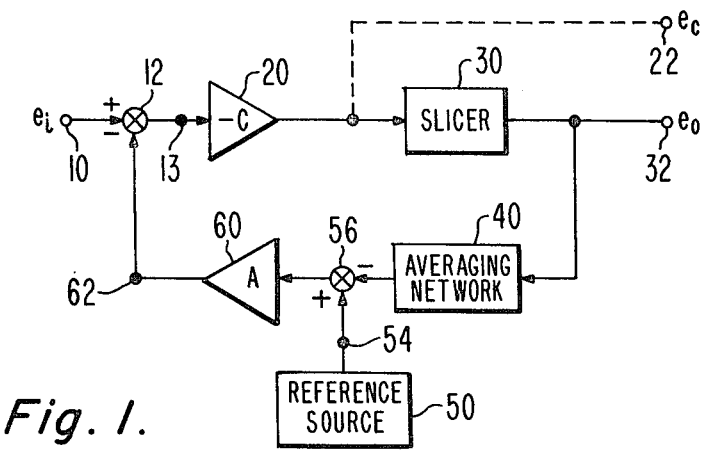
FIG. 1 is a schematic diagram in block form of a detection circuit embodying the invention.
Figure 2:
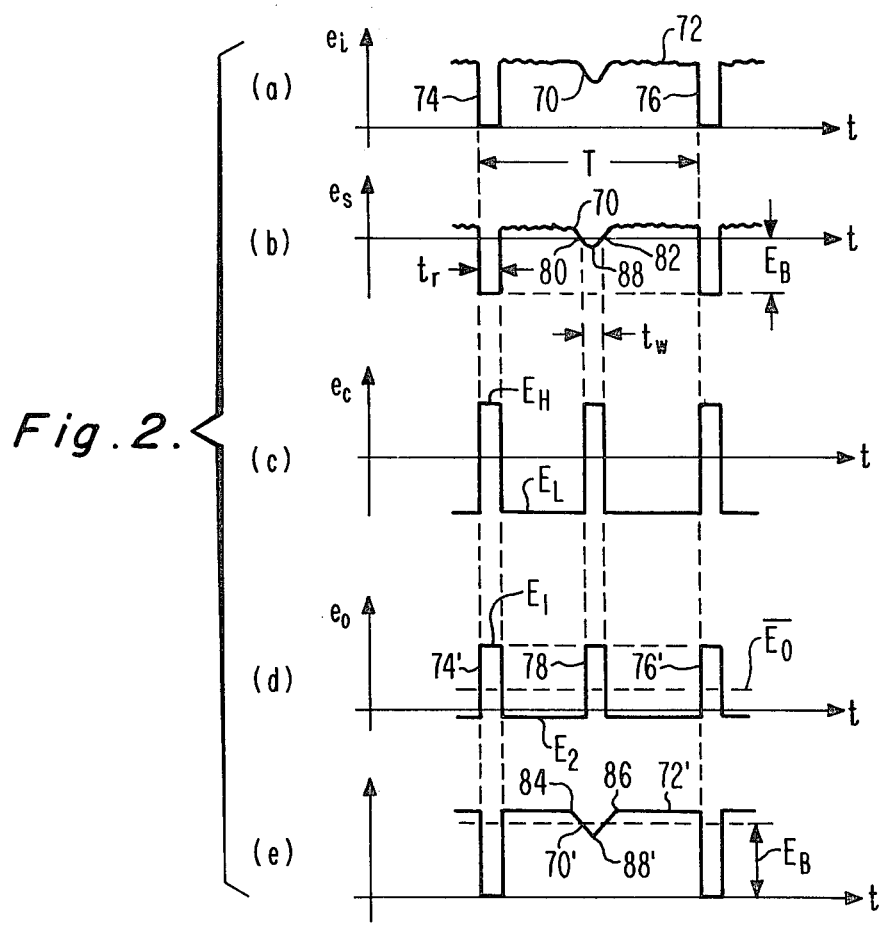
FIG. 2 is a diagram illustrating waveforms at various nodes in the diagram of FIG. 1.

In FIG. 1, an input signal $e_i$ applied at input terminal 10 is passed through a forward signal path including summing point 12, comparator 20 and slicer 30 to output terminal 32. A feedback path for the output signal $e_o$ is provided through averaging network 40, summing point 56 and amplifier 60. The output of averaging network 40 is subtracted at summing point 56 from a standardizing signal 54 generated by reference source 50. The difference signal therefrom is amplified by amplifier 60 and applied at a subtractive input to summing node 12, where it is subtracted from the input signal. The detailed description of this signal detection system may be more easily understood when considered in conjunction with the waveforms of FIG. 2.

The input signal $e_i$ applied to terminal 10, shown in FIG. 2(a), consists of negative-going signal 70 responsive to the feature being detected, which signal is superimposed upon pedestal 72 which constitutes a d-c offsetting potential of the input signal. One cycle of the repetitive waveform $e_i$ has a period T measured between the leading edge 74 of a reset pulse and the leading edge 76 of a reset pulse of a subsequent scan.

The irregular form of pedestal 72 represents its accompaniment by noise from the background of the graphic material, which noise is typically less than the amplitude of the desired signal 70 at detection points 80 and 82 as shown in FIG. 2(b). If, for example, balance voltage $E_B$ is established such that detection points 80 and 82 occur close to peak amplitude point 88 of signal 70, then the desired output waveform $e_o$ is obtained even if the peak amplitude of the noise approaches the peak amplitude 88 of signal 70, i.e. as the signal-to-noise ratio approaches unity. The amplitude of signal 70 may be small as compared to the d-c offset potential of pedestal 72 and the amplitude of reset pulses 74 and 76.

Balance signal $E_B$ (the generation of which is explained below) is subtracted from input signal $e_i$ at summing junction 12. The magnitude of balance signal $E_B$ is such that for summed signal $e_s$ of FIG. 2(b), input signal 70 exhibits crossings of the zero voltage axis at crossing points 80 and 82 respectively. The time duration of the reset pulse is defined as $t_r$ and the time difference between crossing point 80 and crossing point 82 is defined as the pulse width $t_w$.

Comparator 20, shown by way of example as an inverting comparator, receives the signal $e_s$ on its input connection and provides signal $e_c$ at its output connection, the waveform $e_c$ being shown in FIG. 2(c). The response to reset pulse 74 is a voltage level $E_H$ having a time duration $t_r$. The response to input signal 70 is also a potential level $E_H$, but having a time duration of $t_w$. The output of comparator 20 during the remainder of the period T is a voltage level $E_L$. Signal $e_c$ may be used in subsequent circuits and is available at auxiliary output terminal 22 shown in phantom in FIG. 1.

Slicer 30 is a device which transmits only the portions of waveform $e_c$ which lie between two predetermined amplitude boundaries shown in FIG. 2(d) at first potential level $E_1$ in one direction sense and as second potential level $E_2$ in the other direction sense with respect to a first reference potential shown by way of example as ground potential. The value of potential $E_H$ exceeds the value of potential level $E_1$ in the first direction sense while the potential level of $E_L$ exceeds the potential level of $E_2$ in the other direction sense. The width of output pulses 74' and 76' is the reset pulse time $t_r$ and the duration of output pulse 78 is the pulse width $t_w$.

Output signal $e_o$ having average level $\overline{E_o}$, where $$\overline{E_o} = \frac{E_1}{T}(t_r + t_w) + \frac{E_2}{T}(T - t_r - t_w), \qquad [1]$$

is applied to averaging network 40 in the degenerative feedback path. For the particular waveform shown in FIG. 2(d), the value of $E_2$ in equation 1 would be negative.

Reference source 50 generates a substantially constant standardizing potential $E_R$ at node 54. Average output voltage $\overline{E_o}$ from averager 40 is subtracted from potential $E_R$ at second summing junction 56 to generate difference signals. For balance conditions, high-gain in the degenerative feedback loop causes the loop error to approach zero. Thus, the average output voltage $\overline{E_o}$ will substantially equal the standardizing voltage $E_R$ so that the difference signals from summing point 56 tend to be essentially zero, i.e.

$$\overline{E_o} = E_R. \qquad [2]$$

Amplifier 60 responds to this difference signal to generate amplified difference signals $E_B$ at node 62. Amplified difference signals $E_B$ subtract from input signals $e_i$ in summing junction 12 to complete the degenerative feedback loop compensating the input waveform as appearing on node 13.

Dynamic operation of the feedback loop may be understood by the following process. Assume that balance voltage $E_B$ tends to be too great, causing the voltage at node 13, as shown in FIG. 2(b), to tend to shift in a negative direction. This tends to cause the pulse width $t_w$ to increase. Such increase would be transmitted through comparator 20 and slicer 30 to averaging network 40, where the averaged output voltage $\overline{E_o}$ would tend to increase in proportion to the increase in pulse width $t_w$. Such increase would be inverted at summing junction 56 and amplified by amplifier 60 so as to decrease balance voltage $E_B$ at node 62, tending to correct for the excess balance voltage $E_B$ initially assumed.

Similarly, if pedestal voltage 72 of input signal $e_i$ as shown in FIG. 2(a) tends to increase, the resulting tendency at node 13 would be a reduction of the time between axis crossings 80 and 82 shown in FIG. 2(b) and a reduction in the pulse width $t_w$ appearing at the output terminal 32. In response to that tendency, averaged output voltage $\overline{E_o}$ from averaging network 40 tends to be reduced. $\overline{E_o}$ is inverted and amplified by summing junction 56 and amplifier 60 respectively. The amplified tendency towards increased $E_B$ at node 62 then subtracts from the input signal $e_i$ at summing point 12. Thus, the tendency to increase in the magnitude of balance voltage $E_B$ causes the waveform at node 13 to tend to shift such that axis crossings 80 and 82 become further apart in time and the desired pulse width $t_w$ is restored.

It is inherent to the operation of the degenerative feedback loop of this signal detection system that the output waveform, and particularly output pulse width $t_w$, is maintained constant as the input pedestal voltage 72 varies in value or as input signal 70 representing the feature detected changes in amplitude or duration. Mathematically, this result is confirmed by analysis of loop conditions at summing junction 56 by solving equations [1] and [2] for pulse width:

$$t_w = \frac{T(E_R - E_2) - t_r(E_1 - E_2)}{(E_1 - E_2)}. \qquad [3]$$

Pulse width $t_w$ depends only upon substantially constant potential levels $E_1$, $E_2$ and $E_R$ established by the detection system and substantially constant time intervals $t_r$ and T established by the scanning means.

Similar quantitative confirmation of the qualitative corrective tendencies is obtained by mathematical analysis of the loop conditions at summing junction 12. For idealized triangular input signal waveform 70' of FIG. 2(e), balance voltage $E_B$ is given by $$E_B = \frac{e_p(T - t_r) - \frac{e_1 t_s}{2}}{T} \qquad [4]$$

where:
  $e_p$ is the potential level of pedestal 74'
  $e_1$ is the potential difference between pedestal level 72' and potential 88' (pulse peak amplitude), and
  $t_s$ is the time interval between inflection points 84 and 86 (pulse base width).

Amplitude and/or duration changes in signal 70 induce feedback loop responses in the same manner as described above for d-c voltage shifts because the effect of such amplitude or duration changes of signal 70 is to tend to narrow or widen the output pulse width $t_w$. Physically, the width of the scanned feature affects the duration of pulse 70 and the intensity or contrast between the feature and the background of the graphic material affects the amplitude of pulse 70.

As a result, output waveform $e_o$ is independent of the graphic background and it is similarly independent of the characteristics of the feature being detected.

As a result of the invariant output waveform, subsequent signal processing is greatly simplified. Because the pulse width $t_w$ is constant, the center of the pulse 78 corresponds to the center of the detected line whose location may be precisely determined in time during the scan with respect to the leading edge 74 of the reset pulse and the leading edge of the line pulse 78. Thus, the line width detected will be constant irrespective of the actual width of the line, for a wide degree of tolerance of actual width.

A further result of the offset potential compensation means is that the signal detection threshold increases with a strong signal 70 providing an improved signal-to-noise ratio. Variations of the illuminating light source and the background of the graphic material being scanned are rejected. Furthermore, the amplitude of the output signal is constant as determined by first and second potential levels $E_1$ and $E_2$, respectively, so that signals to subsequent stages avoid the problems of AC coupling response, AGC gain changes, or saturation in response to excessive DC inputs as might be encountered if prior art techniques were used.

Further advantage accrues from the characteristic predictability of width $t_w$ of output waveform $e_o$. Validity of the detected signal may be easily verified by direct comparison of time interval $t_w$ against the nominal (expected) duration. Should other than a single feature be detected, multiple output pulses will be generated within each scan period T; the sum of the time durations of such multiple output pulses must equal the nominal duration $t_w$ due to the operation of the degenerative feedback loop. Thus, an out-of-tolerance pulse width of any output pulse is indicative of detection of other than a single feature.

Figure 3:
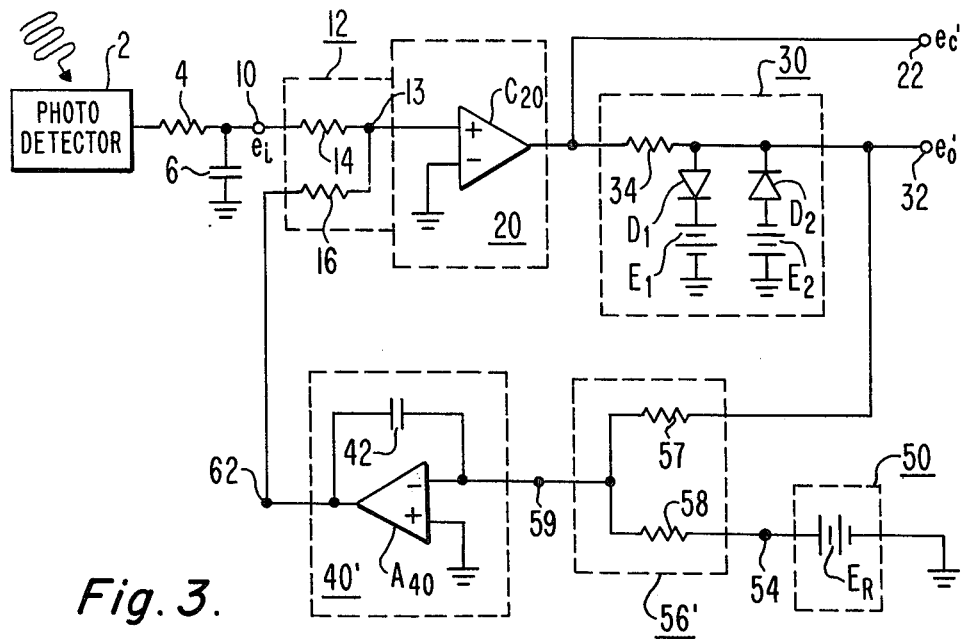
FIG. 3 is a schematic diagram of a detection circuit embodying the invention.

In FIG. 3, input signal $e_i$ at node 10 is generated by photodetector 2 and its smoothing filter consisting of resistor 4 and capacitor 6. Comparison network 12 including resistors 14 and 16, provides a signal at node 13 proportional to the difference between input signal $e_i$ from node 10 and balance signal $E_B$ from node 62. Difference signal $e_s$ is given by $$e_s = \frac{R_{16}e_i}{R_{14} + R_{16}} + \frac{R_{14}E_B}{R_{14} + R_{16}} \qquad [5]$$

where $R_{14}$ and $R_{16}$ represent the values of resistors 14 and 16 respectively, and the value $E_B$ may be oppositely poled from that of $e_i$.

Comparator 20, shown by way of example as differential comparator $C_{20}$, receives modified input signal $e_s$ from node 13, corresponding to FIG. 2(b), at its non-inverting input and a reference level, shown by way of example as ground, at its inverting input.

Resistor 34 between the output of $C_{20}$ and the output connection of slicer network 30 provides source resistance permitting signal limiting to first potential $E_1$ in a first direction sense by conduction of diode $D_1$, and to second voltage $E_2$ in a second direction sense by conduction of diode $D_2$. Potentials $E_1$ and $E_2$ are shown by way of example as positively and negatively poled sources, respectively. Thus, the output voltage waveform $e_o'$ at terminal 32 is substantially clipped at first potential $E_1$ and second potential $E_2$ with respect to ground.

High-gain comparator 20 followed by slicer 30 in cascade connection cooperate to provide the slicer-amplifier function in the forward signal path. Alternatively, a high-gain amplifier may be used in place of high-gain comparator 20 as is described for FIG. 4 below. Where output levels $E_H$ and $E_L$ are substantially constant so as to effectively slice the output waveform, as would be the case when the output voltage waveform $e_c'$ of comparator 20 is limited by the available supply voltages, a separate slicer 30 is not required. Slicer-amplifiers may be alternatively realized by a slicer preceding an amplifier in cascade connection or by a slicer interposed between amplifiers in cascade connection.

The degenerative feedback path includes second summing junction 56' and averaging network 40'. Output signals $e_o'$ from terminal 32 through resistor 57 and standardizing potential $E_R$ from source 50 through resistor 58 are subtractively combined by comparison network 56' to generate difference signals at node 59. Averager 40', including inverting amplifier $A_{40}$ connected to form an integrator by the inclusion of capacitor 42, receives the difference signal from node 59, which signal is a current proportional to voltage $e_o'$ and potential $E_R$. Integrator 40', whose mathematical transfer function approximates that of an averaging device, performs averaging as well as amplification of the difference signal at node 59 to generate balance signal $E_B$ at node 62.

Operation of the degenerative feedback loop of the circuit of FIG. 3 to generate the appropriate balance voltage $E_B$ at node 62 is essentially as described above for FIG. 1. Because the elements in the degenerative feedback path between output terminal 32 and node 62 are linear elements, the operative result is unaffected by the order of the circuit operations. There is no functional difference between subtractively combining $e_o'$ and standardizing potential $E_R$ followed by the averaging function (as in FIG. 3), or averaging $e_o$ and then subtractively combining that average with standardizing potential $E_R$ (as in FIG. 1). Similarly, performing amplification concurrently and simultaneously with averaging (integration) as in FIG. 3 is no different in result from performing averaging separately and before amplification (as in FIGS. 1 and 4).

Figure 4:
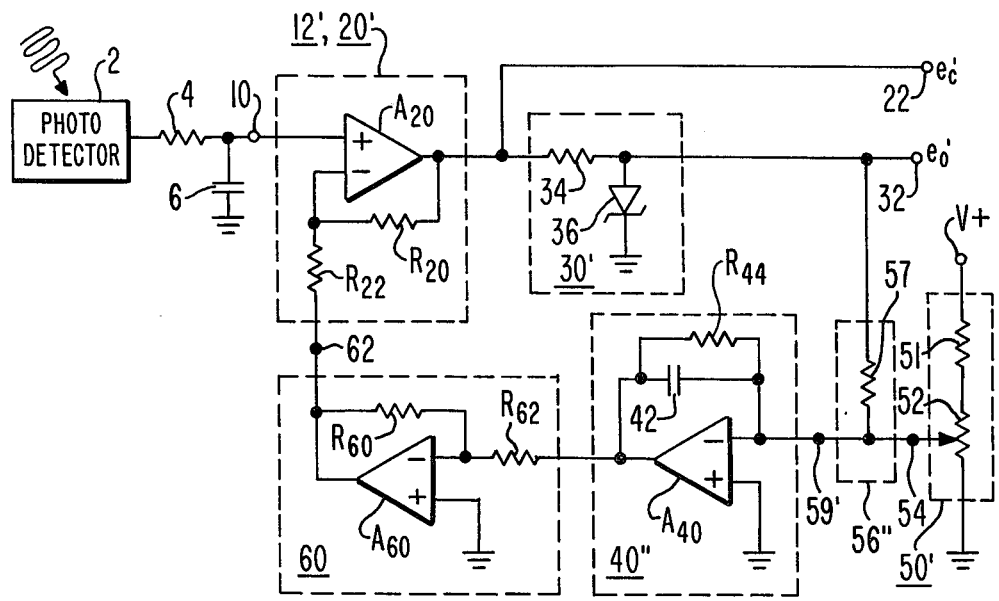
FIG. 4 is a schematic diagram of an alternative embodiment of the invention.

FIG. 4 shows an alternative embodiment of the invention including photodetector 2 and filter 4, 6 described above for FIG. 3. Signals at input terminal 10 are like those shown in FIG. 2(a) while the polarity sense of output waveform $e_o'$ at terminal 32 is opposite to that shown in FIG. 2(d).

The functions of summing junction 12' and comparison 20' are combined in network 12', 20' which includes a differential-input, high-gain amplifier $A_{20}$ whose gain is determined bhy resistors $R_{20}$ and $R_{22}$. $A_{20}$ receives input signals $e_i$ on its non-inverting input (+) which signals are subtractively compared with balance signals $E_B$ from node 62 received on its inverting input (−). Slicer 30' includes resistor 34 and avalanche diode 36 which limits, by way of example, the positive-going excursion of output voltage $e_o'$ at terminal 32 to its forward conduction potential and the negative-going excursion at terminal 32 to its avalanche breakdown potential.

Standardizing source 50', shown by way of example as voltage divider 51, 52 biased by potential source V+ generates a standardizing signal at node 54 proportional to reference potential $E_R$. Standardizing potential $E_R$ in this embodiment corresponds to the Thevenin equivalent voltage of source 50' and bias voltage V+. Resistor 52 is further shown by way of example as a potentiometer to permit adjustment of the detection level of the signal detection system or, viewed in a different light, to permit adjustment of the output pulse width $t_w$. Second summing junction 56'' combines the standardizing signal (current) from source 50' via node 54 and the output waveform from terminal 32 applied through resistor 57. The difference signal (current) at node 59' is subsequently amplified and averaged by averaging network 40″ and applied to amplifier 60. Averager 40″ includes amplifier $A_{40}$, averaging capacitor 42 and gain setting resistor $R_{44}$. Operational amplifier $A_{60}$, connected in inverting configuration to provide a properly poled signal at node 62 to maintain a degenerative feedback sense, has gain determined by resistors $R_{60}$ and $R_{62}$. The degenerative feedback loop connection is completed by resistor $R_{22}$ which conducts balance signal $E_B$ from node 62 to the inverting input of amplifier $A_{20}$, which effectively performs the summing junction 12′ function.

What is claimed is:

1. A system for detecting repetitive input signals superimposed upon offset potential levels for providing an output signal having a waveform substantially independent of said offset potential, and substantially independent of the amplitude and duration of said input signals, said system comprising:
   a forward signal path for conducting said input signals from an input terminal to an output terminal;
   slicing-amplifying means included in said forward signal path and having an input connection for receiving the difference between said input signals and a balance signal, and an output connection supplying amplified signals to said output terminal in response to said difference signals, the amplitude excursions of said amplified signals being clipped in one direction sense at a first potential level and in the other direction sense at a second potential level, said first and second potential levels being substantially constant with respect to a first reference potential;
   a feedback path connected between said output terminal and said input terminal to form a degenerative feedback loop;
   means included in said feedback path for generating balance signals in proportion to the amplified difference between the average value of said output signal and a standardizing potential; and
   means coupled between said input terminal and said balance signal generating means for subtractively combining said input signals and said balance signals.

2. A system according to claim 1 wherein said slicing-amplifying means comprises comparator means having an input connection to receive signals proportional to the difference between said input signals and said balance signals and an output connection for providing output signals of a first output state in response to signals of a first polarity sense at its input connection and of a second output state in response to signals of opposite polarity sense at its input connection, which polarity sense is with respect to a second reference potential.

3. A system according to claim 1 wherein said slicing-amplifying means comprises:
   differential-input amplifying means having a first input connection for receiving said input signals and having a second input connection for receiving said balance signals, and having an output responsive to the amplified difference between the signals at said first and second input connections; and
   means for slicing the output signal of said differential-input amplifying means including means for clipping excursions of said output waveform tending to exceed said first potential level in one direction sense and means for clipping excursions of said output waveform tending to exceed said second potential level in the other direction sense.

4. A system according to claim 3 wherein said slicing means further comprises resistor means connected between input and output connections of said slicing means, first diode means connecting a first potential source to said slicing means output connection, and second diode means connecting a second potential source to said slicing means output connection.

5. A system according to claim 1 wherein said means for generating balance signals comprises:
   means for generating a standardizing potential level, said standardizing potential being of fixed value relative to said first reference potential level;
   means for generating further signals proportional to the difference between said average value of said output waveform and said standardizing potential level; and
   means for amplifying said further signals for providing said balance signals.

6. A system according to claim 1 wherein said means for generating balance signals comprises:
   means for generating signals proportional to the difference between said output waveform and said standardizing potential;
   means for generating further signals proportional to the average value of said difference signals; and
   means for amplifying said further signals for providing said balance signals.

7. A system according to claim 6 wherein said means for generating further signals and said means for amplifying said further signals together comprise integrating means including inverting amplifier means having an integrating capacitor connected between its input and output connections.

8. A system for detecting repetitive input signals superimposed upon offset potential levels, for providing an output signal having a waveform substantially independent of said offset potential, and substantially independent of the amplitude and duration of said input signals, said system comprising:
   first and second resistance means in series connection, connected at one end to receive said input signals and connected at the other end to receive a balance signal;
   comparator means having input, output and reference connections, said input connection being connected between said first and second resistance means, for providing signals at said comparator means output connection having first and second output states responsive to the polarity sense of the signals at said comparator means input connection with respect to the potential at said comparator means reference connection;
   slicer means for generating a first output potential level in response to said first output state of said comparator means output signals and a second output potential level in response to said second output state of said comparator means output signals, said first and second output potential levels being substantially constant with respect to a reference potential;
   third and fourth resistance means in series connection, connected at one end to receive said first and second output potential levels generated by said slicing means and connected at the other end to a source of standardizing potential;
   integrating means for generating said balance signal including inverting amplifying means having an input connection to the interconnection of said third and fourth resistance means and having an output connection, said integrating means further including a capacitor connected between the input and output connections of said inverting amplifying means; and means for completing a degenerative feedback connection for conducting said balance signal between said output connection of said integrating means and said other end of said first and second resistance means.

9. A system for detecting repetitive input signals superimposed upon offset potential levels, for providing an output waveform substantially independent of said offset potential, and substantially independent of the amplitude and duration of said input signals, said system comprising:

difference-amplifying means having a non-inverting-input connection for receiving said input signals, an inverting-input connection and an output connection, and a first resistance means connected between its inverting-input connection and its output connection;

slicing means having input and output connections with second resistance means connected therebetween, which input is connected to receive signals from the output connection of said difference-amplifying means, and having avalanche diode means connecting its output connection to a point of reference potential for limiting the potential at said output connection to the forward-conduction potential of said avalanche diode means in a first direction sense and to the reverse-breakdown potential of said avalanche diode means in a second direction sense;

voltage divider means having a substantially constant bias voltage applied to an input terminal thereof for generating a standardizing signal at an output terminal thereof in response to said bias voltage;

third resistance means connected between said output connection of said slicing means and said output terminal of said voltage divider means;

averaging means including first inverting-amplifying means having an input connection to said output terminal of said voltage divider means, an output connection, and capacitance means connected between said input and output connections of said first inverting-amplifying means;

second inverting-amplifying means for generating balance signals at its output connection proportional to the output signals of said averaging means; and fourth resistance means for completing a degenerative feedback connection for conducting said balance signals between said output connection of said second inverting-amplifying means and said inverting-input connection of said difference amplifying means.

* * * * *

UNITED STATES PATENT AND TRADEMARK OFFICE
CERTIFICATE OF CORRECTION

PATENT NO. : 4,263,555
DATED      : April 21, 1981
INVENTOR(S) : George William Hunka It is certified that error appears in the above—identified patent and that said Letters Patent is hereby corrected as shown below:

Column 4, Line 43 — "pedestal 74'" should be -- pedestal 72' -- ; and

Column 6, Line 43 — "bhy" should be -- by -- .

Signed and Sealed this

Second Day of March 1982

[SEAL]

Attest:

Attesting Officer

GERALD J. MOSSINGHOFF

Commissioner of Patents and Trademarks